United States Patent
Min et al.

(10) Patent No.: US 9,942,963 B2
(45) Date of Patent: Apr. 10, 2018

(54) APPARATUS FOR MANUFACTURING FLUORESCENT LAYERS

(71) Applicant: LIGHTIZER KOREA CO., Kangnam-ku (KR)

(72) Inventors: Jae Sik Min, Anyang (KR); Jae Young Jang, Anyang (KR); Jae Yeop Lee, Anyang (KR); Byoung Gu Cho, Anyang (KR)

(73) Assignee: LIGHTIZER KOREA CO., Seoul (KR)

( * ) Notice: Subject to any disclaimer, the term of this patent is extended or adjusted under 35 U.S.C. 154(b) by 381 days.

(21) Appl. No.: 14/013,452

(22) Filed: Aug. 29, 2013

(65) Prior Publication Data
US 2014/0367548 A1 Dec. 18, 2014

(30) Foreign Application Priority Data
Jun. 14, 2013 (KR) .................. 10-2013-0068152

(51) Int. Cl.
*H05B 33/10* (2006.01)

(52) U.S. Cl.
CPC ...... *H05B 33/10* (2013.01); *H01L 2933/0041* (2013.01)

(58) Field of Classification Search
CPC ... H01L 33/50; H01L 33/00; H01L 2924/171; H01L 2933/0041; H01L 33/502; H01L 33/005; H01L 21/50; H01L 21/48; H01L 2924/181; H01L 33/56; H01L 33/507; H01L 33/486; H01L 33/54; B28B 7/24; B22C 9/06; G02F 1/133516; F21K 9/235; F21K 9/237; G02B 1/14; B32B 2457/202; B32B 7/24; H05B 33/10; C09K 11/00
(Continued)

(56) References Cited

U.S. PATENT DOCUMENTS

2006/0154305 A1 * 7/2006 Lauf .................. B01L 3/5085
435/7.1
2010/0301360 A1 * 12/2010 van de Ven ............ F21V 3/02
257/98
(Continued)

FOREIGN PATENT DOCUMENTS

CN 103022325 A * 4/2013 .......... H01L 33/505
KR 1020080055549 6/2008
(Continued)

OTHER PUBLICATIONS

Machine Translation of KR 201000128574A.*

*Primary Examiner* — Matthew J Daniels
*Assistant Examiner* — Leith S Shafi
(74) *Attorney, Agent, or Firm* — Hunter E. Webb; Keohane & D'Alessandro PLLC

(57) ABSTRACT

The present invention relates to an apparatus for manufacturing fluorescent layers and, more particularly, to an apparatus for manufacturing fluorescent layers, which converts light from a light-emitting diode into white light by varying a wavelength of the light emitted from the light-emitting diode. The present invention provides the apparatus for manufacturing fluorescent layers includes a vertical frame and a fluorescent layer pattern hole formed in a direction vertical to the vertical frame in a fluorescent layer pattern form within the vertical frame.

5 Claims, 2 Drawing Sheets

(58) Field of Classification Search
USPC ............ 249/119, 117, 60, 174, 203; 199/48; 264/297.1, 297.8
See application file for complete search history.

(56) References Cited

U.S. PATENT DOCUMENTS

2013/0149508 A1* 6/2013 Kwak .................... H01L 33/505
428/201
2015/0287891 A1* 10/2015 Liu ........................ H01L 33/505
257/98

FOREIGN PATENT DOCUMENTS

| KR | 1020080070193 A | 7/2008 |
| KR | 1020100128574 | 9/2011 |
| KR | 102007007892 | 5/2012 |

* cited by examiner

APPARATUS FOR MANUFACTURING FLUORESCENT LAYERS

CROSS REFERENCE TO RELATED APPLICATION

The present application claims the benefit of Korean Patent Application No. 10-2013-0068152 filed in the Korean Intellectual Property Office on Jun. 14, 2013, the entire contents of which are incorporated herein by reference.

BACKGROUND OF THE INVENTION

1. Technical Field

The present invention relates to an apparatus for manufacturing fluorescent layers and, more particularly, to an apparatus for manufacturing fluorescent layers, which converts light from a light-emitting diode into white light by varying a wavelength of the light emitted from the light-emitting diode.

2. Description of the Related Art

Recently, a light-emitting diode in which Al or In has been added to GaN has been in the spotlight owning to longer lifespan, low power consumption, excellent brightness, and eco-friendly factors not harmful to the human being, as compared with a conventional incandescent electric lamp. In particular, a light-emitting diode chip that provides white light by adopting a fluorescent layer has been in the spotlight.

The light-emitting diode is being used in vehicle lamps, traffic lights, and the Back Light Unit (BLU) of a liquid crystal display device because of the above advantages.

Recently, MacAdam's Ellipse Rule was proposed as an index for estimating whether or not color coordinates measured in an artificial light source are the same as color coordinates seen by an eye of the human being. This MacAdam Ellipse Rule provides a 4-step criterion. Currently, in the United States, an artificial light source is not allowed to be sold if the artificial light source does not comply with three steps of the MacAdam Ellipse Rule. In order to satisfy the three steps of the MacAdam's Ellipse Rule, it is very important to reduce a color deviation in white light.

Meanwhile, Korean Patent Laid-Open Publication No. 10-2008-0070193 discloses a fluorescent film in which fluorescent materials are formed on a surface of a film made of resin. If the fluorescent film is attached to a light-emitting diode, the fluorescent film is not effectively attached to a desired position of the light-emitting diode due to electrostatic force or adhesive force occurring between the fluorescent materials and the film made of resin. Accordingly, it is difficult to reduce a color deviation in white light, and a reliability problem is generated due to poor adhesive force between the light-emitting diode and the fluorescent film.

Furthermore, the above fluorescent film includes the fluorescent materials formed on a surface of the film made of resin. In order to attach the fluorescent film to a light-emitting diode in which electrode pads are formed, the fluorescent film needs to be previously cut in a form in which the fluorescent film can be disposed in parts other than the electrode pads. As a result, there is a problem in that an additional process is added.

SUMMARY OF THE INVENTION

Accordingly, the present invention has been made keeping in mind the above problems occurring in the prior art, and an object of the present invention is to provide an apparatus for manufacturing fluorescent layers, which can effectively block electrostatic force or adhesive force occurring between fluorescent materials and a film made of resin, and also manufacture fluorescent layers having excellent adhesive force with a light-emitting diode.

Another object of the present invention is to provide an apparatus for manufacturing fluorescent layers, which can manufacture fluorescent layers without a process of cutting the fluorescent film in a form in which the fluorescent film can be disposed in parts other than the electrode pads.

Technical objects to be achieved by the present invention are not limited to the above-described objects and a person having ordinary skill in the art to which the present invention pertains can evidently appreciate other technical objects that have not been described above.

An apparatus for manufacturing fluorescent layers in accordance with an embodiment of the present invention includes a vertical frame and a fluorescent layer pattern hole formed in a direction vertical to the vertical frame in a fluorescent layer pattern form within the vertical frame.

In the apparatus for manufacturing fluorescent layers in accordance with an embodiment of the present invention, the fluorescent layer pattern hole may include a shape of pad electrodes.

In the apparatus for manufacturing fluorescent layers in accordance with an embodiment of the present invention, the vertical frame may be made of non-transmissive materials that do not transmit light.

In the apparatus for manufacturing fluorescent layers in accordance with an embodiment of the present invention, the viscosity of a fluorescent material solution filled in the fluorescent layer pattern hole may be 1,000 cP to 300,000 cP.

In the apparatus for manufacturing fluorescent layers in accordance with an embodiment of the present invention, the fluorescent layer material solution may include fluorescent materials, silicon, and a filler.

An apparatus for manufacturing fluorescent layers in accordance with another embodiment of the present invention includes a vertical frame and a plurality of fluorescent layer pattern holes, each formed in a direction vertical to the vertical frame in a fluorescent layer pattern form, within the vertical frame.

In the apparatus for manufacturing fluorescent layers in accordance with another embodiment of the present invention, the fluorescent layer material solution may include fluorescent materials, silicon, and a filler.

DETAILED DESCRIPTION

Exemplary embodiments of the present invention are described in detail with reference to the accompanying drawings.

Figure 1:
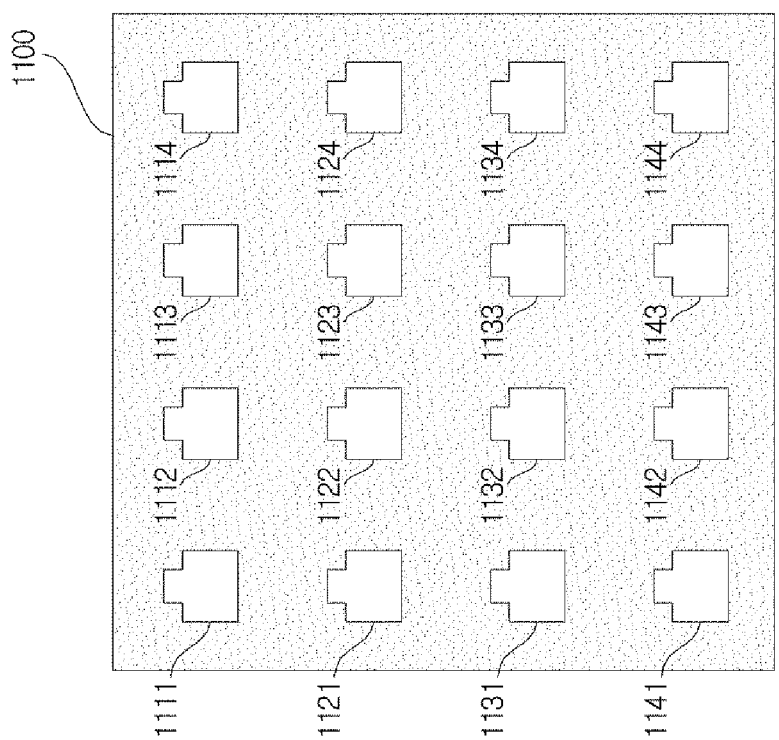
FIG. 1 is a plan view of an apparatus for manufacturing fluorescent layers in accordance with an embodiment of the present invention.
Figure 2:
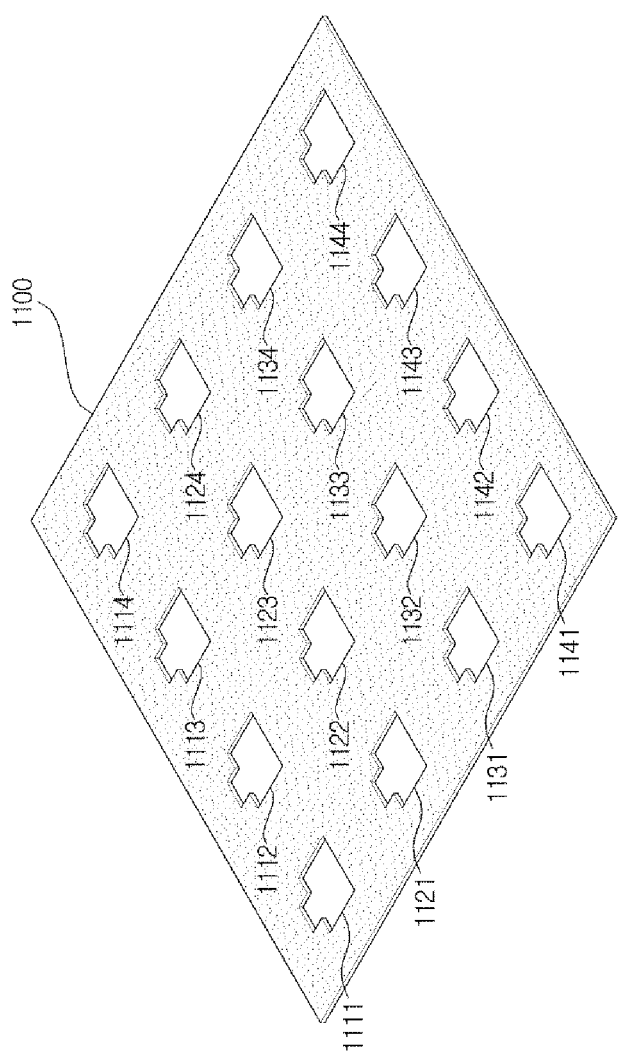
FIG. 2 is a perspective view of the apparatus for manufacturing fluorescent layers in accordance with an embodiment of the present invention.

An apparatus for manufacturing fluorescent layers in accordance with an embodiment of the present invention, as shown in FIG. 1 or 2, may include a vertical frame 1100 and a plurality of fluorescent layer pattern holes 1111 to 1114, 1121 to 1124, 1131 to 1134, and 1141 to 1144, each formed in the form of a fluorescent layer pattern in a direction vertical to the vertical frame 1100, within a specific region of the vertical frame 1100.

Each of the plurality of fluorescent layer pattern holes 1111 to 1114, 1121 to 1124, 1131 to 1134, and 1141 to 1144 can have a shape of pad electrodes. In particular, as shown in FIG. 1 or 2, rectangular forms are included on the upper left and upper right sides of each of the plurality of fluorescent layer pattern holes 1111 to 1114, 1121 to 1124, 1131 to 1134, and 1141 to 1144. When fluorescent layers are manufactured by filling each of the plurality of fluorescent layer pattern holes 1111 to 1114, 1121 to 1124, 1131 to 1134, and 1141 to 1144 with a fluorescent material solution, pad electrodes can be disposed on the upper left and upper right sides of the fluorescent layer.

Meanwhile, in the plurality of fluorescent layer pattern holes 1111 to 1114, 1121 to 1124, 1131 to 1134, and 1141 to 1144, a shape of pad electrodes does not need to be necessarily included on the upper left and upper right sides, as shown in FIG. 1 or FIG. 2. The shape of pad electrodes may be included at various positions, such as upper center, lower left, lower center, and lower right, if necessary.

Furthermore, only the pad electrodes having a rectangular form do not need to be included in the plurality of fluorescent layer pattern holes 1111 to 1114, 1121 to 1124, 1131 to 1134, and 1141 to 1144 as shown in FIG. 1 or 2, but electrode pads having various shapes, such as a circle, a triangle, a pentagon, and a hexagon, can be included, if necessary.

Here, the vertical frame 1100 can be made of non-transmissive materials that do not transmit light. In particular, the vertical frame 1100 can be made of non-transmissive metal materials, such as aluminum (Al) or Stainless Steel, or non-transmissive insulating materials, such as silicon or silicon oxide. If the vertical frame 1100 is made of non-transmissive materials that do not transmit light as described above, a test can be effectively performed because light emitted from a light-emitting diode does not pass through the vertical frame 1100, but only passes through the fluorescent layers in the case where the fluorescent layers dried in the fluorescent layer pattern holes 1111 to 1114, 1121 to 1124, 1131 to 1134, and 1141 to 1144 are placed over the light-emitting diode and the test is performed on the characteristics of light passing through the fluorescent layer when the light is emitted from the light-emitting diode.

Meanwhile, the fluorescent layers can be fabricated by filling the plurality of fluorescent layer pattern holes 1111 to 1114, 1121 to 1124, 1131 to 1134, and 1141 to 1144 with a fluorescent material solution having viscosity of about 1,000 cP to 300,000 cP. If the fluorescent material solution having the above-described viscosity is used, the yield of the fluorescent layers can be stably maintained because the fluorescent material solution can be effectively maintained in the plurality of fluorescent layer pattern holes 1111 to 1114, 1121 to 1124, 1131 to 1134, and 1141 to 1144.

A method of manufacturing fluorescent layers using the apparatus for manufacturing fluorescent layers in accordance with an embodiment of the present invention is described below.

First, the plurality of fluorescent layer pattern holes 1111 to 1114, 1121 to 1124, 1131 to 1134, and 1141 to 1144 is filled with a fluorescent material solution including fluorescent material (phosphor), silicon, and a filler for converting light from a light-emitting diode into white light by varying a wavelength of the light emitted from the light-emitting diode.

Next, the vertical frame 1100 filled with the fluorescent material solution is dried by baking the vertical frame 1100 in a temperature range of 50° C. to 200° C. for about 5 minutes to 100 minutes.

Next, the top and bottom of the vertical frame 1100 filled with the fluorescent material solution are polished.

Next, after the fluorescent layers dried in the fluorescent layer pattern holes 1111 to 1114, 1121 to 1124, 1131 to 1134, and 1141 to 1144 are placed over the light-emitting diode, the characteristics of light passing through the fluorescent layers when light is emitted from the light-emitting diode are tested.

In the apparatus for manufacturing fluorescent layers in accordance with embodiments of the present invention, fluorescent materials are not formed on a surface of a film made of resin, but fluorescent layers are manufactured by filling the fluorescent layer pattern holes, formed in a vertical frame, with the fluorescent material solution. In some embodiments, the fluorescent layer patterns holes are formed within a region (i.e. a portion lesser than the whole) of the vertical frame. In either case, accordingly, electrostatic force or adhesive force occurring between the fluorescent materials and the film made of resin can be effectively blocked.

Furthermore, if fluorescent layers are manufactured using the apparatus for manufacturing fluorescent layers in accordance with embodiments of the present invention, adhesive force with a light-emitting diode can be effectively improved because a film made of resin is not present in the fluorescent layer.

Furthermore, in the apparatus for manufacturing fluorescent layers in accordance with embodiments of the present invention, a process of cutting the fluorescent layer in a form in which the fluorescent layer can be disposed in parts other than electrode pads is not necessary because a shape of the pad electrodes is included in the fluorescent layer pattern hole formed in the vertical frame.

Furthermore, in the apparatus for manufacturing fluorescent layers in accordance with embodiments of the present invention, the fluorescent layers are manufactured by filling the fluorescent layer pattern holes, formed in the vertical frame, with the fluorescent material solution. Accordingly, the fluorescent layers dried in the fluorescent layer pattern holes are placed over a light-emitting diode before the fluorescent layers are attached to the light-emitting diode, the characteristics of light passing through the fluorescent layers when the light is emitted from the light-emitting diode are tested, and a fluorescent layer satisfying criteria can be selected. Accordingly, the yield of fluorescent layer can be significantly increased.

A person having ordinary skill in the art will appreciate that the present invention can be changed and modified in various ways without departing from the spirit and scope of the present invention.

Accordingly, all proper changes, modifications, and equivalents should be construed as belonging to the scope of the present invention.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing fluorescent layers, comprising:

providing a vertical frame; the vertical frame having a plurality of fluorescent layer pattern holes extending completely through the vertical frame, each fluorescent layer pattern hole of the plurality of fluorescent layer pattern holes being formed in a direction vertical to the vertical frame and having a desired shape of a fluorescent layer;

filling the fluorescent layer pattern holes with a viscous fluorescent material solution that has a viscosity between 1,000 cP to 300,000 cP;

stably maintaining the viscous fluorescent material solution within the fluorescent layer pattern holes in the vertical frame until the viscous fluorescent material has dried, viscous fluorescent material solution being maintained within each of the fluorescent layer pattern holes that are filled based on a viscosity of the viscous fluorescent material solution and without using a horizontal surface;

polishing a top surface and a bottom surface of the vertical frame; and attaching a fluorescent layer removed from the vertical frame to a light emitting diode (LED), wherein the desired shape of the fluorescent layer pattern holes allows the fluorescent layer to be attached to the LED without further cutting of the fluorescent layer.

2. The method of claim 1, wherein the fluorescent layer pattern hole comprises a cutout in a shape of pad electrodes.

3. The method of claim 1, wherein the vertical frame is made of non-transmissive materials that do not transmit light.

4. The method of claim 1, wherein the fluorescent layer material solution comprises fluorescent material, silicon, and a filler.

5. The method of claim 3, further comprising testing light transmission characteristics of the fluorescent layers while the fluorescent layers are in the vertical frame, wherein the vertical frame is configured to allow characteristics of light passing through the fluorescent layer to be tested by passing light from an unattached light emitting diode through the fluorescent layer while the fluorescent layer is contained in the vertical frame in which the fluorescent layer was originally formed.

* * * * *